(12) United States Patent
Yoon et al.

(10) Patent No.: US 8,299,595 B2
(45) Date of Patent: Oct. 30, 2012

(54) INTEGRATED CIRCUIT PACKAGE SYSTEM WITH PACKAGE STACKING AND METHOD OF MANUFACTURE THEREOF

(75) Inventors: In Sang Yoon, Ichon-si (KR); SeongMin Lee, Seoul (KR); SangJin Lee, Seongnam-si (KR)

(73) Assignee: Stats Chippac Ltd., Singapore (SG)

( * ) Notice: Subject to any disclaimer, the term of this patent is extended or adjusted under 35 U.S.C. 154(b) by 329 days.

(21) Appl. No.: 12/727,229

(22) Filed: Mar. 18, 2010

(65) Prior Publication Data
US 2011/0227209 A1 Sep. 22, 2011

(51) Int. Cl.
*H01L 23/40* (2006.01)
(52) U.S. Cl. . 257/686; 257/777; 257/723; 257/E21.499; 438/109
(58) Field of Classification Search .......... 257/686, 257/E21.499, E23.085, 777, 723; 438/109
See application file for complete search history.

(56) References Cited

U.S. PATENT DOCUMENTS

| | | |
|---|---|---|
| 7,196,427 B2 | 3/2007 | Mangrum |
| 7,217,993 B2 | 5/2007 | Nishimura |
| 7,345,361 B2 | 3/2008 | Mallik et al. |
| 7,642,133 B2 | 1/2010 | Wu et al. |
| 7,714,453 B2 | 5/2010 | Khan et al. |
| 2007/0190690 A1 | 8/2007 | Chow et al. |
| 2008/0073769 A1 | 3/2008 | Wu et al. |
| 2008/0179717 A1 | 7/2008 | Wu |
| 2009/0236731 A1 | 9/2009 | Shim et al. |
| 2011/0140258 A1* | 6/2011 | Do et al. .............. 257/686 |

OTHER PUBLICATIONS

U.S. Appl. No. 12/711,250, filed Feb. 23, 2010, Chi et al.
U.S. Appl. No. 12/410,945, filed Mar. 25, 2009, Chi et al.
U.S. Appl. No. 12/714,320, filed Feb. 26, 2010, Yang et al.
U.S. Appl. No. 12/434,367, filed May 1, 2009, Chi et al.

* cited by examiner

*Primary Examiner* — Roy Potter
(74) *Attorney, Agent, or Firm* — Ishimaru & Associates LLP; Mikio Ishimaru; Stanley M. Chang

(57) ABSTRACT

A method of manufacture of an integrated circuit package system includes: forming a base package including: fabricating a base package substrate having a component side and a system side, coupling a first integrated circuit die to the component side, and coupling stacking interconnects to the component side to surround the first integrated circuit die; forming a stacked integrated circuit package including: fabricating a stacked package substrate having a chip side, coupling a lower stacked integrated circuit die to the chip side, and attaching on a coupling side, of the stacked package substrate, the stacking interconnects; stacking the stacked integrated circuit package on the base package including the stacking interconnects of the stacked integrated circuit package on the stacking interconnects of the base package; and forming a stacked solder column by reflowing the stacked interconnects.

18 Claims, 6 Drawing Sheets

INTEGRATED CIRCUIT PACKAGE SYSTEM WITH PACKAGE STACKING AND METHOD OF MANUFACTURE THEREOF

CROSS-REFERENCE TO RELATED APPLICATION(S)

The present application contains subject matter related to U.S. patent application Ser. No. 12/714,320 filed Feb. 26, 2010, now U.S. Pat. No. 8,067,306. The related application is assigned to STATS ChipPAC Ltd. and the subject matter thereof is incorporated herein by reference thereto.

TECHNICAL FIELD

The present invention relates generally to an integrated circuit package system, and more particularly to a system for package-on-package stacking.

BACKGROUND ART

Important and constant goals of the computer industry include higher performance, lower cost, increased miniaturization of components, and greater packaging density for integrated circuits ("ICs"). As new generations of IC products are released, the number of IC devices needed to fabricate them tends to decrease due to advances in technology. Simultaneously, the functionality of these IC products increases. For example, on the average there is approximately a 10 percent decrease in components required for every IC product generation over a previous generation having equivalent functionality.

Semiconductor package structures continue to become thinner and ever more miniaturized. This results in increased component density in semiconductor packages and decreased sizes of the IC products in which the packages are used. These developmental trends are in response to continually increasing demands on electronic apparatus designers and manufacturers for ever-reduced sizes, thicknesses, and costs, along with continuously improving performance.

These increasing requirements for miniaturization are particularly noteworthy, for example, in portable information and communication devices such as cell phones, hands-free cell phone headsets, personal data assistants ("PDA's"), camcorders, notebook personal computers, and so forth. All of these devices continue to be made smaller and thinner to improve their portability. Accordingly, large-scale integration ("LSI") packages incorporated into these devices, as well as the package configurations that house and protect them, must also be made smaller and thinner.

Many conventional semiconductor chip or die packages are of the type having a semiconductor die molded into a package with a resin, such as an epoxy molding compound. The packages have a leadframe whose out leads are projected from the package body to provide a path for signal transfer between the chip and external devices. Other conventional package configurations have contact terminals or pads formed directly on the surface of the package.

In IC packaging, in addition to component size reduction, surface mount technology ("SMT") has demonstrated an increase in semiconductor chip density on a single substrate (such as a printed circuit board ("PCB")) despite the reduction in the number of components. SMT is a method used to connect packaged chips to substrates. With SMT, no throughholes in the substrate are required. Instead, package leads are soldered directly to the substrate surface. This results in more compact designs and form factors, and a significant increase in IC density and performance. However, despite these several reductions in size, IC density continues to be limited by the space or "real estate" available for mounting chips on a substrate.

One method to further increase IC density is to stack semiconductor chips vertically. Multiple stacked chips can be combined into a single package in this manner with a very small surface area or "footprint" on the PCB or other substrate. This strategy of stacking IC components vertically has in fact been extended to the stacking of entire packages upon each other. Such package-on-package ("PoP") configurations continue to become increasingly popular as the semiconductor industry continues to demand semiconductor devices with lower costs, higher performance, increased miniaturization, and greater packaging densities. Continuing substantial improvements in PoP technology are anticipated to address these requirements.

Unfortunately, limitations of current PoP stacking techniques can interfere with the ready incorporation and utilization of existing die and package configurations. It can reduce the effective reliability of the package due to movement of the packages with changes in temperature. The movement or warping of package substrates can damage die exposed on a base substrate or fracture interconnects between the substrates.

For example, in a previous PoP configuration, the base package has bonding pads on the top side that allow surface mounting of a top or second package. In order to successfully and effectively mount the top package on the base package, it is necessary to have sufficient clearance or "headroom" between the packages for accommodating structures, such as dies or a mold cap, on the top of the base package. However, typically due to cost and efficiency considerations, the only physical structure connecting the top package and the base package is the electrical interface between them. This electrical interface is usually a solder ball matrix on the bottom of the top package that aligns with bonding pads on the top of the base package.

Previous techniques employing such solder ball matrices usually afford only a small space or stand-off provided by the nominal height of the solder balls. This limits the available height for the base package components on the top of the base package, such as one or more semiconductor dice. Since the primary goal of the integration is to reduce the size of the package clearances are held to a minimum.

The problem of limited space between the base package and the top package increases the critical dimensions and manufacturing difficulty of the PoP. The integrated circuit die on the base package, if exposed, may be damaged during or after assembly by the movement of the two packages caused by different rates of thermal expansion and rigidity.

Thus, while a need still remains for smaller, thinner, lighter, less-expensive integrated circuit PoP systems, a great need also remains for PoP systems that simplify the assembly process and help address the warping issue that can damage the integrated circuit die of the base package. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package system including: forming a base package including: fabricating a base package substrate having a component side and a system side, coupling a first integrated circuit die to the component side, and coupling stacking interconnects to the component side to surround the first integrated circuit die; forming a stacked integrated circuit package including: fabricating a stacked package substrate having a chip side, coupling a lower stacked integrated circuit die to the chip side, and attaching on a coupling side, of the stacked package substrate, the stacking interconnects; stacking the stacked integrated circuit package on the base package including the stacking interconnects of the stacked integrated circuit package on the stacking interconnects of the base package; and forming a stacked solder column by reflowing the stacked interconnects.

The present invention provides an integrated circuit package system, includes: a base package including: a base package substrate having a component side and a system side, a first integrated circuit die coupled to the component side, and first stacking interconnects coupled to the component side to surround the first integrated circuit die; a stacked integrated circuit package on the base package including: a stacked package substrate having a chip side, a lower stacked integrated circuit die coupled to the chip side, and a coupling side, of the stacked package substrate, with second stacking interconnects mounted includes the second stacking interconnects on the first stacking interconnects of the base package; and a stacked solder column formed by reflow of the first stacked interconnects and the second stacked interconnects.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
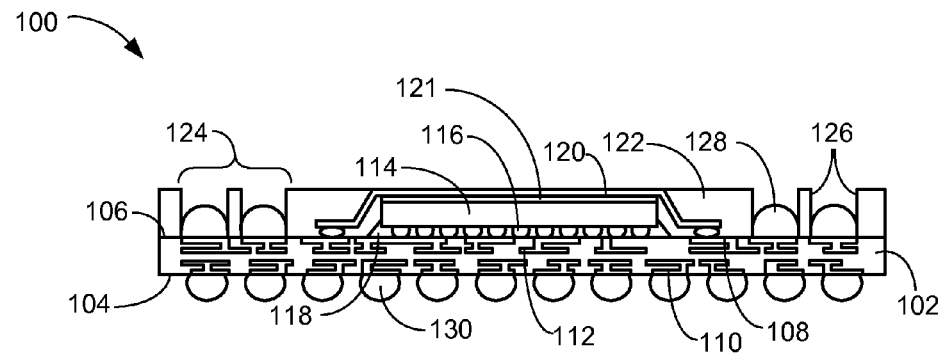
FIG. 1 is a cross-sectional view of a base package taken along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the base package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening materials.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
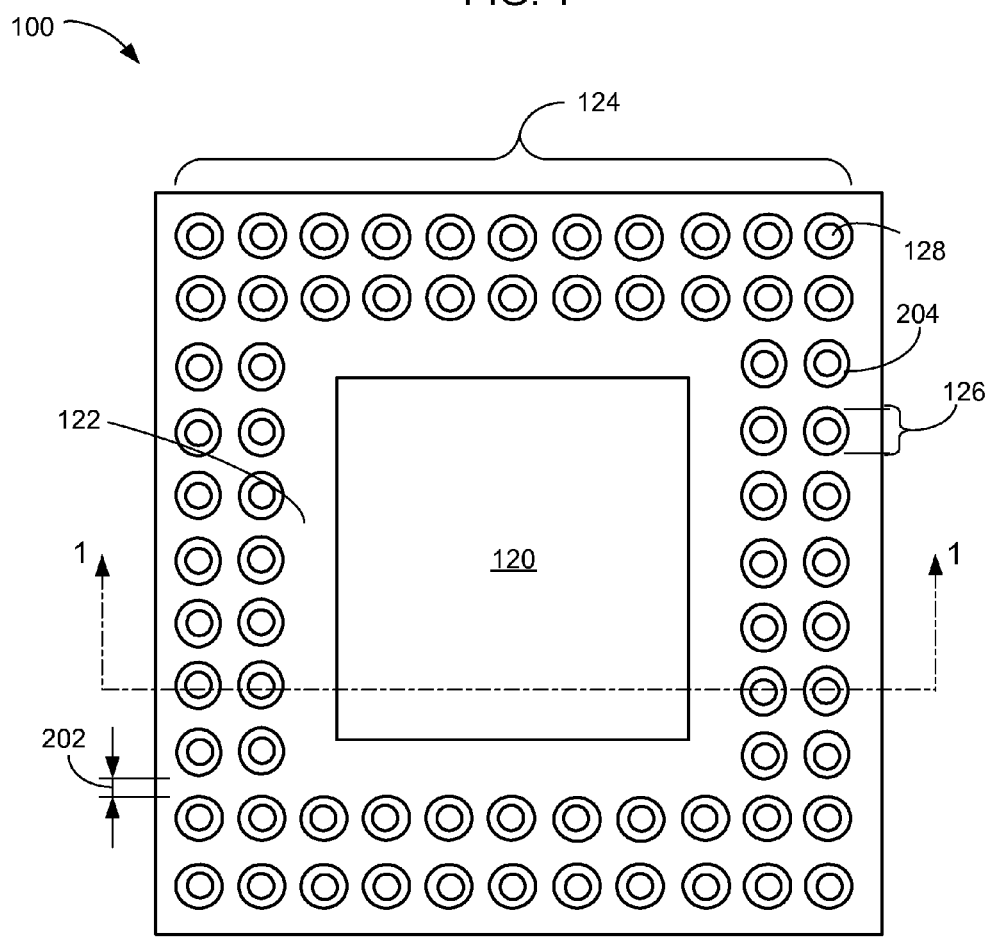
FIG. 2 is a top view of the base package of FIG. 1.

Referring now to FIG. 1, therein is shown a cross-sectional view of a base package 100 taken along a line 1-1 of FIG. 2 in a first embodiment of the present invention. The cross-sectional view of the base package 100 depicts a base package substrate 102 having a system side 104 and a component side 106.

Component pads 108 on the component side 106 may be coupled to system pads 110 on the system side 104 by internal circuitry 112, such as traces, vias, or a combination thereof. A first integrated circuit die 114, such as a flip chip die, may be coupled to the component pads by chip interconnects 116.

An adhesive material 118, such as under fill material, may be applied between the first integrated circuit die 114 and the component side 106. The adhesive material 118 may completely enclose the chip interconnects 116 and the active side of the first integrated circuit die 114.

A shield 120, such as an electro-magnetic interference (EMI) shield formed of a foil of copper (Cu), Tin (Sn), Aluminum (Al), and alloy thereof, or other conductive materials, may be adhered on the back side of the first integrated circuit die 114 by a thermal adhesive 121 and coupled to the component pads 108 by the chip interconnects 116. The shield 120 may also act as a heat spreader to dissipate heat generated by the first integrated circuit die 114 during operation.

A package body 122 may be formed by injection molding of an epoxy molding compound to cover the component side 106 while leaving the top surface of the shield 120 exposed to the outside environment. The top surface of the package body 122 to be coplanar with or below the top surface of the shield 120.

An array 124 of vertical insertion cavities 126 may be formed in the package body 122 by a laser ablation process. This process may be identified by the evidence of melting on the vertical sidewalls of each of the vertical insertion cavities 126.

Stacking interconnects 128, such as solder balls, may be formed in the vertical insertion cavities 126. The stacking interconnects 128 may form an electrical connection between the first integrated circuit die 114, system interconnects 130, formed on the system pads 110, another of the stacking interconnects 128, or a combination thereof.

It has been discovered that the present invention provides the base package 100 with package stacking capability. The stacking interconnects 128 in the vertical insertion cavities 126 of the package body 122 provide high density electrical connectivity for package stacking The stacking interconnects 128 in the vertical insertion cavities 126 also reduces the keep out zones due to the package body 122 acting as a barrier between the stacking interconnects 128 and the reduction of the keep out zones allows a further increase in the density of the stacking interconnects 128 for reliable stacking of high I/O count integrated circuit devices (not shown).

It has also been discovered that the present invention provides the base package 100 with higher reliability and higher yield. The package body 122 with the vertical insertion cavities 126 prevents warpage and mechanical damage while improving surface mount technology yield. The reduction in warpage also improves reliability of the base package 100.

Referring now to FIG. 2, therein is shown a top view of the base package 100 of FIG. 1. The top view of the base package 100 depicts the package body 122 having the array 124 of the vertical insertion cavities 126 positioned around the top side of the shield 120.

The array 124 of the vertical insertion cavities 126 may be precisely positioned by the laser ablation process. A wall thickness 202 may be precisely set to provide an increase in the number of the stacking interconnects 128 available. A melted area 204 may exist around the opening at the stacking interconnects 128. The melted area 204 may be created by the process that forms the vertical insertion cavity 126.

It has been discovered that the increase in the number of the vertical insertion cavities 126 does not decrease the ability of the package body 122 to reduce the warpage of the base package substrate 102.

Figure 3:
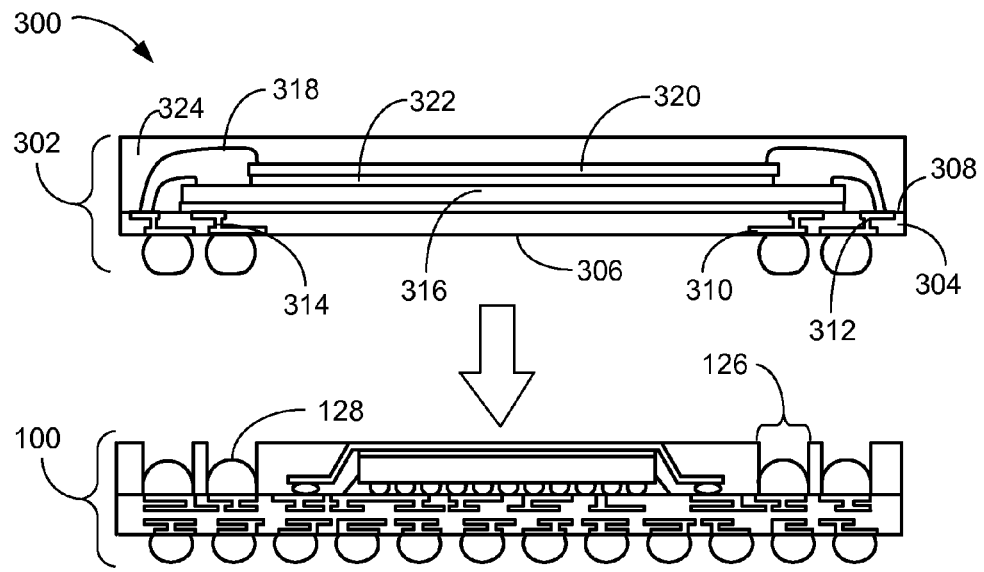
FIG. 3 is a cross-sectional view of known good packages in a package stacking process.

Referring now to FIG. 3, therein is shown a cross-sectional view of known good packages 300 in a package stacking process. The cross-sectional view of known good packages 300 depicts the base package 100 having the stacking interconnects 128 in preparation of stacking a stacked integrated circuit package 302. Both of the base package 100 and the stacked integrated circuit package 302 are tested prior to assembly. This process provides a marked increase in manufacturing yield and reliability of the finished assembly.

The stacked integrated circuit package 302 may have a stacked package substrate 304. The stacked package substrate 304 may have a coupling side 306 and a chip side 308. Coupling contacts 310 on the coupling side 306 may have the stacking interconnects 128 formed thereon. It has been discovered that by using the same size of the stacking interconnects 128 on the stacked integrated circuit package 302, a precise coupling can be made in the vertical insertion cavities 126 of the base package 100.

Chip side contacts 312 are coupled to the coupling contacts 310 by vias 314. A lower stacked integrated circuit die 316 may be coupled to the chip side contacts 312 by electrical interconnects 318, such as bond wires, solder bumps, solder columns, or stud bumps. It is understood that the lower stacked integrated circuit die 316 is shown as a wire bond type of die as an example only and it could also be a flip chip type of integrated circuit die.

An upper stacked integrated circuit die 320 may be mounted over the lower stacked integrated circuit die 316 by an adhesive material 322, such as die attach material. The electrical interconnects 318 may couple the upper stacked integrated circuit die 320 to the chip side contacts 312. The resulting circuit may electrically connect the upper stacked integrated circuit die 320 to the lower stacked integrated circuit die 316, the stacking interconnects, or a combination thereof.

A mold cap 324 may be formed on the chip side 308, the lower stacked integrated circuit die 316, the upper stacked integrated circuit die 320, the electrical interconnects 318, and the adhesive material 322. The mold cap 324 may be formed of an epoxy molding compound, or an injectable ceramic compound.

Figure 4:
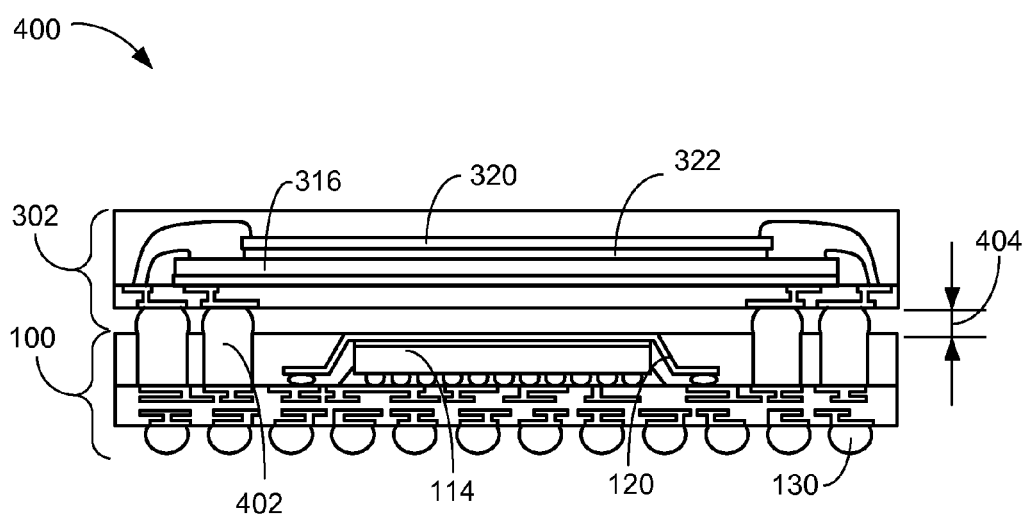
FIG. 4 is a cross-sectional view of an integrated circuit package system with package stacking in a first embodiment of the present invention.

Referring now to FIG. 4, therein is shown a cross-sectional view of an integrated circuit package system 400 with package stacking in a first embodiment of the present invention. The cross-sectional view of the integrated circuit package system 400 depicts the base package 100 having the stacked integrated circuit package 302 mounted thereon.

During the reflow process the stacking interconnects 128, of FIG. 1, become fused to form a stacked solder column 402. The height of the stacked solder column 402 may be precisely adjusted by the size of the stacking interconnects 128 prior to the reflow process. A separation height 404 may be adjusted by the final height of the stacked solder columns 402.

The shield 120 may provide a protection of the first integrated circuit die 114. It may also provide shielding for the stacked solder columns 402 and the lower stacked integrated circuit die 316 from electro-magnetic interference generated by the first integrated circuit die 114.

It has been discovered that the integrated circuit package system 400 may provide shielding and cooling for the first integrated circuit die while maintaining a low structure profile. The size and spacing of the stacked solder columns 402 allows a flexible and repeatable manufacturing process that can provide a high density of input/output interconnects between the base package 100 and the stacked integrated circuit package 302.

Figure 5:
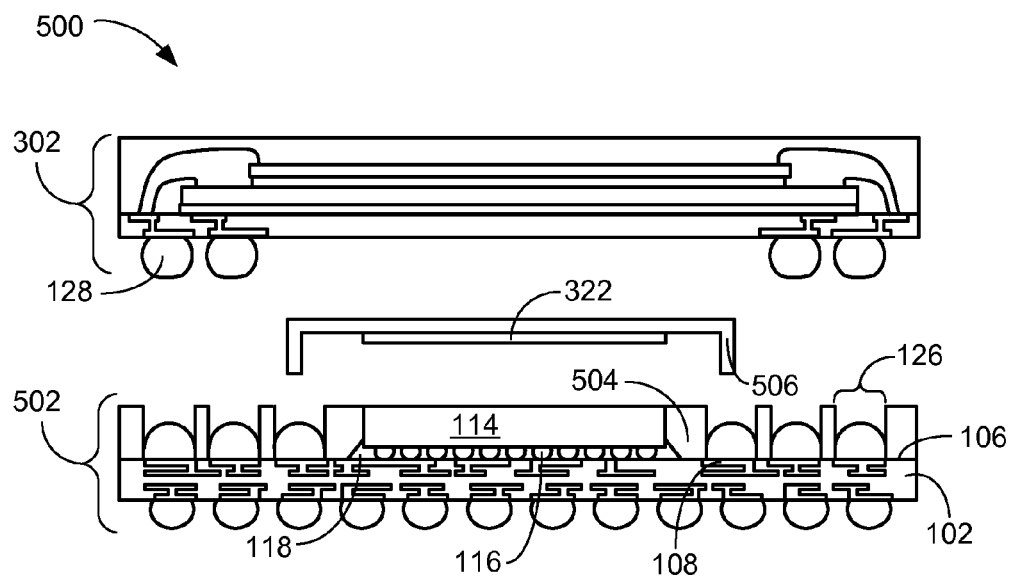
FIG. 5 is a cross-sectional view of known good packages in a package stacking process in a second embodiment of the present invention.

Referring now to FIG. 5, therein is shown a cross-sectional view of known good packages 500 in a package stacking process in a second embodiment of the present invention. The cross-sectional view of the known good packages 500 depicts a base package 502 having the base package substrate 102.

The first integrated circuit die 114 is mounted on the component side 106 and coupled to the component pads 108. The adhesive material 118 may be applied between the active side of the first integrated circuit die 114 and the component side 106 to enclose the chip interconnects 116.

A package body 504 may be formed on the component side 106 the first integrated circuit die 114, and the adhesive material 118. The package body 504 is similar to the package body 122, of FIG. 1, with the exception that there is an extra row of the vertical insertion cavities 126 adjacent to the first integrated circuit die 114.

The inner row of the vertical insertion cavities 126 may be reflowed to accept the insertion of a discrete shield 506, such as a conductive foil of copper (Cu), Tin (Sn), Aluminum (Al), and alloy thereof, or other conductive materials, that will eventually rest on the back side of the first integrated circuit die 114. The discrete shield 506 may have a layer of the adhesive material 322, such as die attach material applied to a bottom side. It has been discovered that the discrete shield 506 may provide additional flexibility in the manufacturing process by allowing the addition of the discrete shield in the base package 502 that could be used for other applications.

The discrete shield 506 may provide an EMI shield between the first integrated circuit die and the devices in the stacked integrated circuit package 302. The discrete shield 506 may also act as a heat spreader to dissipate heat generated by the first integrated circuit die 114 during operation.

The stacked integrated circuit package 302 may be positioned with the stacking interconnects 128 over the vertical insertion cavities 126 of the package body 504 for further assembly. Both of the stacked integrated circuit package 302 and the base package 502 may be previously tested in order to enhance the manufacturing yield and provide a reliable assembly that is resistant to warpage.

Figure 6:
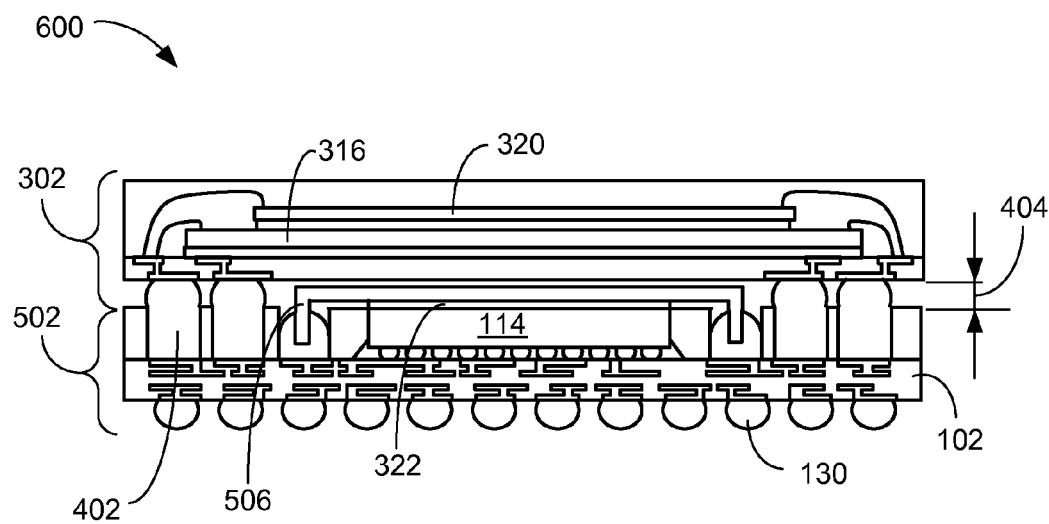
FIG. 6 is a cross-sectional view of an integrated circuit package system with package stacking in a second embodiment of the present invention.

Referring now to FIG. 6, therein is shown a cross-sectional view of an integrated circuit package system 600 with package stacking in a second embodiment of the present invention. The cross-sectional view of the integrated circuit package system 600 depicts the base package 502 having the stacked integrated circuit package 302 mounted thereon.

During the reflow process the stacking interconnects 128, of FIG. 1, become fused to form the stacked solder column 402. The height of the stacked solder column 402 may be precisely adjusted by the size of the stacking interconnects 128 prior to the reflow process. The separation height 404 may be adjusted by the final height of the stacked solder columns 402.

The stacked solder columns 402 may provide a coupling path between the system interconnects 130, the first integrated circuit die 114, the lower stacked integrated circuit die 316, the upper stacked integrated circuit die 320, or a combination thereof. This coupling may provide a significant fan-in of the input/output count. The term fan-in is defined as the lower number of signals required on the next level system, such as a printed circuit board (not shown), due to the internal connections within the integrated circuit package system 600.

The discrete shield 506 may provide a protection of the first integrated circuit die 114. It may also provide shielding for the stacked solder columns 402 and the lower stacked integrated circuit die 316 from electro-magnetic interference generated by the first integrated circuit die 114.

The discrete shield 506 also provides the option to adjust the separation height 404 to allow the stacked integrated circuit package 302 to also contact the discrete shield 506. In this fashion the discrete shield 506 may act as a heat spreader for both the stacked integrated circuit package 302 and the first integrated circuit die 114.

The anchor locations of the discrete shield 506 may be coupled to a reference voltage for EMI shielding or tied to one or several of the ground connections provided by the system interconnects 130. The addition of the discrete shield 506 does not add additional height to the overall package profile.

Figure 7:
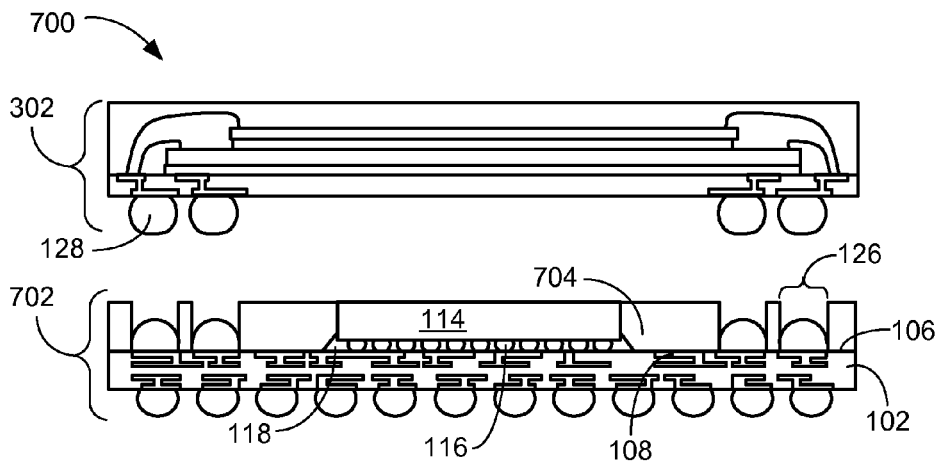
FIG. 7 is a cross-sectional view of known good packages in a package stacking process in a third embodiment of the present invention.

Referring now to FIG. 7, therein is shown a cross-sectional view of known good packages 700 in a package stacking process in a third embodiment of the present invention. The cross-sectional view of the known good packages 700 depict a base package 702 having the base package substrate 102.

The first integrated circuit die 114 is mounted on the component side 106 and coupled to the component pads 108. The adhesive material 118 may be applied between the active side of the first integrated circuit die 114 and the component side 106 to enclose the chip interconnects 116.

A package body 704 may be formed on the component side 106 the first integrated circuit die 114, and the adhesive material 118. The package body 704 is similar to the package body 122, of FIG. 1, with the exception that there is not the shield 120, of FIG. 1, included in this implementation.

The stacked integrated circuit package 302 may be positioned with the stacking interconnects 128 over the vertical insertion cavities 126 of the package body 704 for further assembly. Both of the stacked integrated circuit package 302 and the base package 702 may be previously tested in order to enhance the manufacturing yield and provide a reliable assembly that is resistant to warpage.

Figure 8:
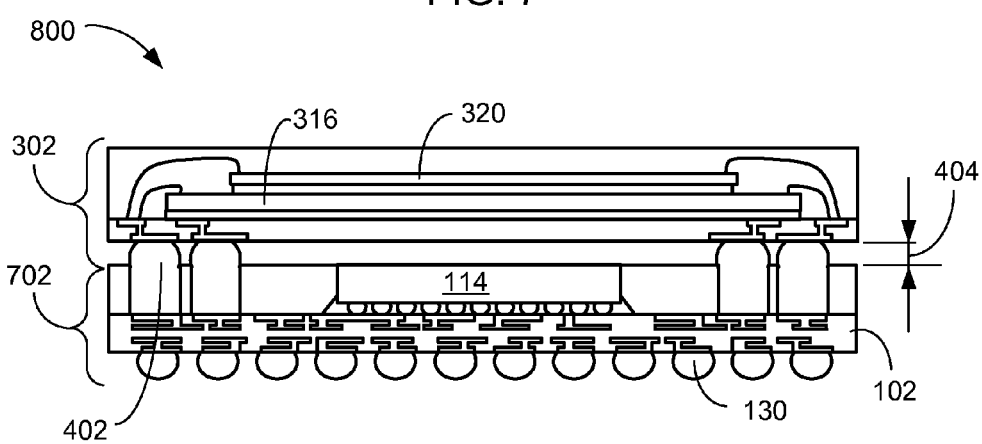
FIG. 8 is a cross-sectional view of an integrated circuit package system with package stacking in a third embodiment of the present invention.

Referring now to FIG. 8, therein is shown a cross-sectional view of an integrated circuit package system 800 with package stacking in a third embodiment of the present invention. The cross-sectional view of the integrated circuit package system 800 depicts the base package 702 having the stacked integrated circuit package 302 mounted thereon.

During the reflow process the stacking interconnects 128, of FIG. 1, become fused to form the stacked solder column 402. The height of the stacked solder column 402 may be precisely adjusted by the size of the stacking interconnects 128 prior to the reflow process. The separation height 404 may be adjusted by the final height of the stacked solder columns 402.

The stacked solder columns 402 may provide a coupling path between the system interconnects 130, the first integrated circuit die 114, the lower stacked integrated circuit die 316, the upper stacked integrated circuit die 320, or a combination thereof. This coupling may provide a significant fan-in of the input/output count. The term fan-in is defined as the lower number of signals required on the next level system, such as a printed circuit board (not shown), due to the internal connections within the integrated circuit package system 800.

Figure 9:
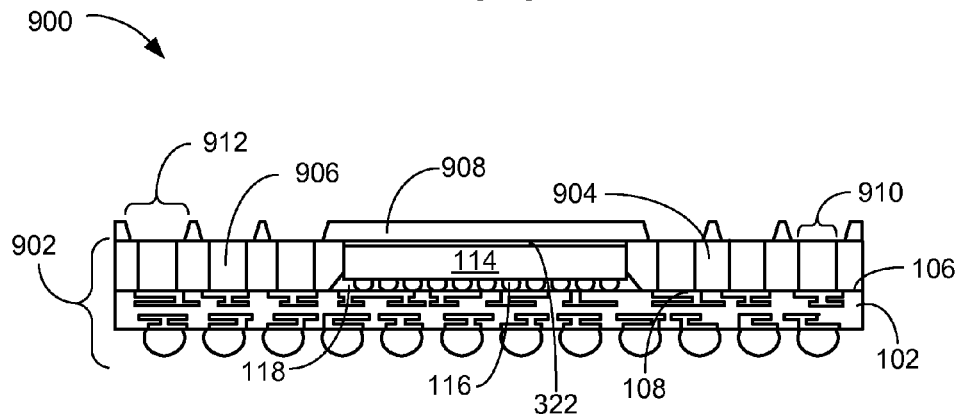
FIG. 9 is a cross-sectional view of a base package taken along a line 9-9 of FIG. 12 in a fourth embodiment of the present invention.
Figure 12:
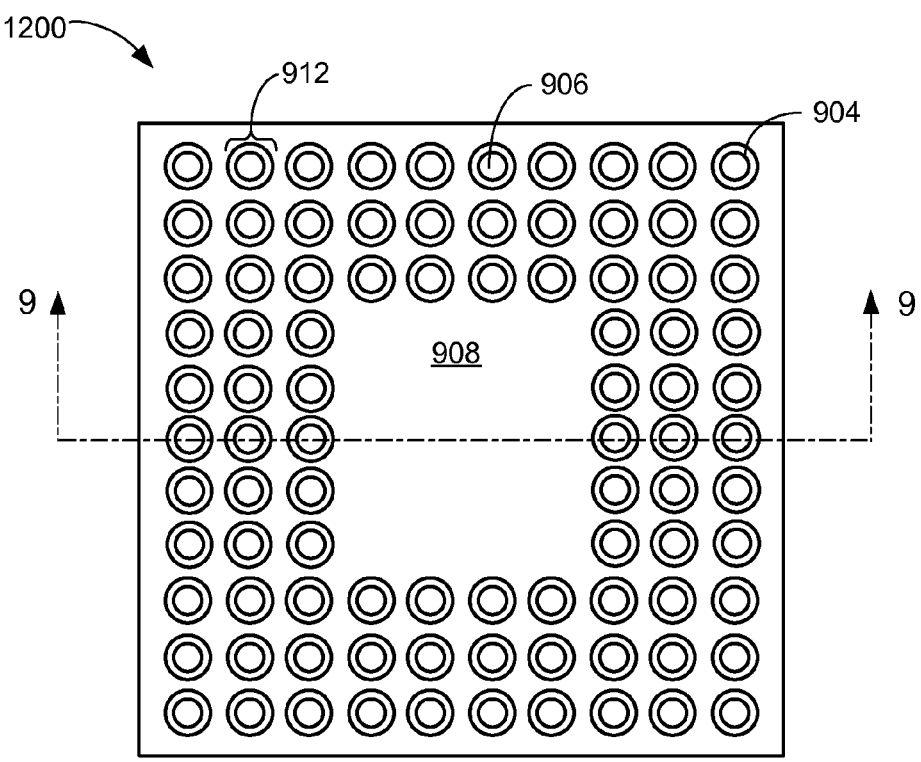
FIG. 12 is a top view of the base package in the fourth embodiment of the present invention.

Referring now to FIG. 9, therein is shown a cross-sectional view of a base package 900 taken along a line 9-9 of FIG. 12 in a fourth embodiment of the present invention. The cross-sectional view of the base package 900 depicts a base package 902 having the base package substrate 102.

The first integrated circuit die 114 is mounted on the component side 106 and coupled to the component pads 108. The adhesive material 118 may be applied between the active side of the first integrated circuit die 114 and the component side 106 to enclose the chip interconnects 116.

A package body 904 may be formed on the component side 106 the first integrated circuit die 114, and the adhesive material 118. The package body 904 is formed around cylinder conductors 906, such as solder columns, that are coupled to the component pads 108 on the component side.

A heat spreader cap 908 is mounted on the first integrates circuit die 114 with the adhesive material 322 and across the surface of the package body 904. The heat spreader cap 908 may be formed of a thermally conductive material, such as copper (Cu), Tin (Sn), Aluminum (Al), or an alloy thereof.

The cylinder conductors 906 may have a cylinder diameter 910 that is smaller than a heat spreader aperture 912. The difference in the size of the heat spreader aperture 912 and the cylinder diameter 910 provides a manufacturing tolerance for connecting the cylinder conductors 906 without forming an inadvertent connection or short to the heat spreader cap 908.

It has been discovered that the addition of the heat spreader cap 908 may enhance the thermal performance of the base package 902 without adding additional height to the package stack, such as the integrated circuit package system 800, of FIG. 8. Additionally, the heat spreader apertures 912 may be precisely positioned by a laser ablation process, etching process, or other process. The additional rigidity of the heat spreader cap 908 also prevents the warpage of the base package 902 during the manufacturing cycle.

Figure 10:
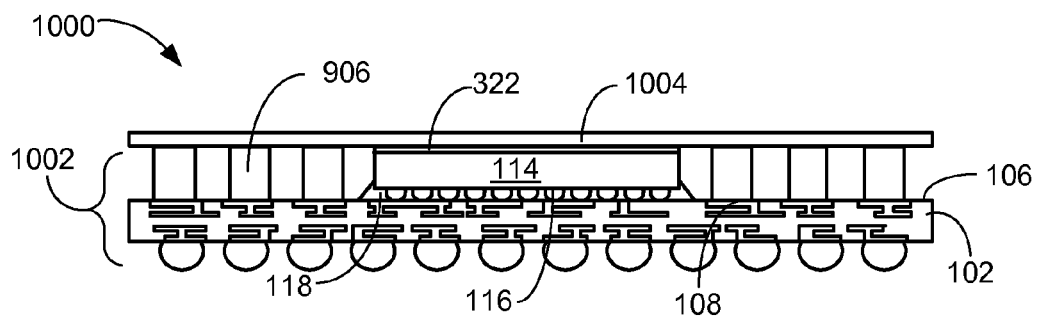
FIG. 10 is a cross-sectional view of a base package in an assembly phase of manufacturing.

Referring now to FIG. 10, therein is shown a cross-sectional view of a base package 1000 in an assembly phase of manufacturing. The cross-sectional view of the base package 1000 depicts a package base 1002 having the base package substrate 102.

The first integrated circuit die 114 is mounted on the component side 106 and coupled to the component pads 108. The adhesive material 118 may be applied between the active side of the first integrated circuit die 114 and the component side 106 to enclose the chip interconnects 116.

The cylinder conductors 906 are coupled to the component pads 108 to surround the first integrated circuit die 114. A conductive plate 1004 may be adhered to the first integrated circuit die 114 by the adhesive material 322 and is in contact with all of the cylinder conductors 906. The adhesive material 322 is a good thermal conductor.

Figure 11:
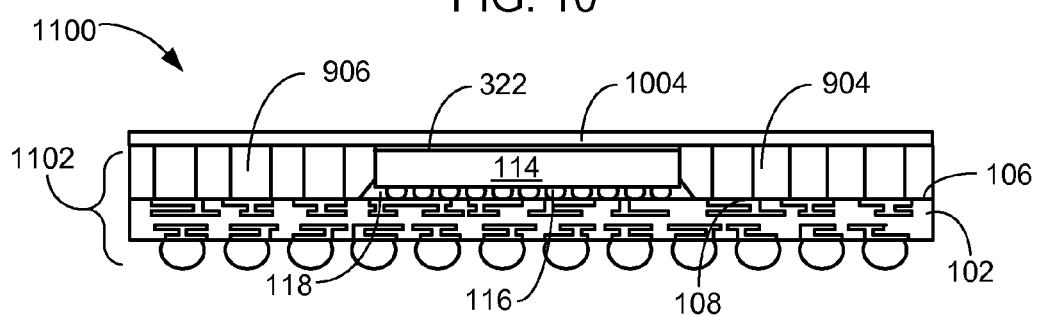
FIG. 11 is a cross-sectional view of a base package in a molding phase of manufacturing.

Referring now to FIG. 11, therein is shown a cross-sectional view of a base package 1100 in a molding phase of manufacturing. The cross-sectional view of the base package 1100 depicts a package base 1102 having the base package substrate 102.

The first integrated circuit die 114 is mounted on the component side 106 and coupled to the component pads 108. The adhesive material 118 may be applied between the active side of the first integrated circuit die 114 and the component side 106 to enclose the chip interconnects 116.

The cylinder conductors 906 are coupled to the component pads 108 to surround the first integrated circuit die 114. The conductive plate 1004 may be adhered to the first integrated circuit die 114 by the adhesive material 322 and is in contact with all of the cylinder conductors 906. The adhesive material 322 is a good thermal conductor.

The package body 904 may be formed on the component side 106 the first integrated circuit die 114, and the adhesive material 118. The package body 904 is formed around the cylinder conductors 906, such as solder columns, that are coupled to the component pads 108 on the component side.

It has been discovered that the molding of the package body 904 provides higher manufacturing yield because the cylinder conductors 906 are held rigidly on both ends and are less likely to shift or bend due to the pressure of the molding process. The lack of movement of the cylinder conductors 906 allows closer grouping and an increase in the number of input/output signals that can be reliably manufactured in a limited space. This favorably supports the trend for smaller packages with an increased number of the input/output signals.

Referring now to FIG. 12, therein is shown a top view of the base package 900 in the fourth embodiment of the present invention. The top view of the base package 900 depicts the heat spreader cap 908 having the heat spreader apertures 912 formed in an array around the central region. Each of the heat spreader apertures 912 exposes the cylinder conductor 906 surrounded by the package body 904. The section line 9-9 shows the position and direction of view of FIG. 9 and is representative of FIGS. 10 and 11 as well.

Figure 13:
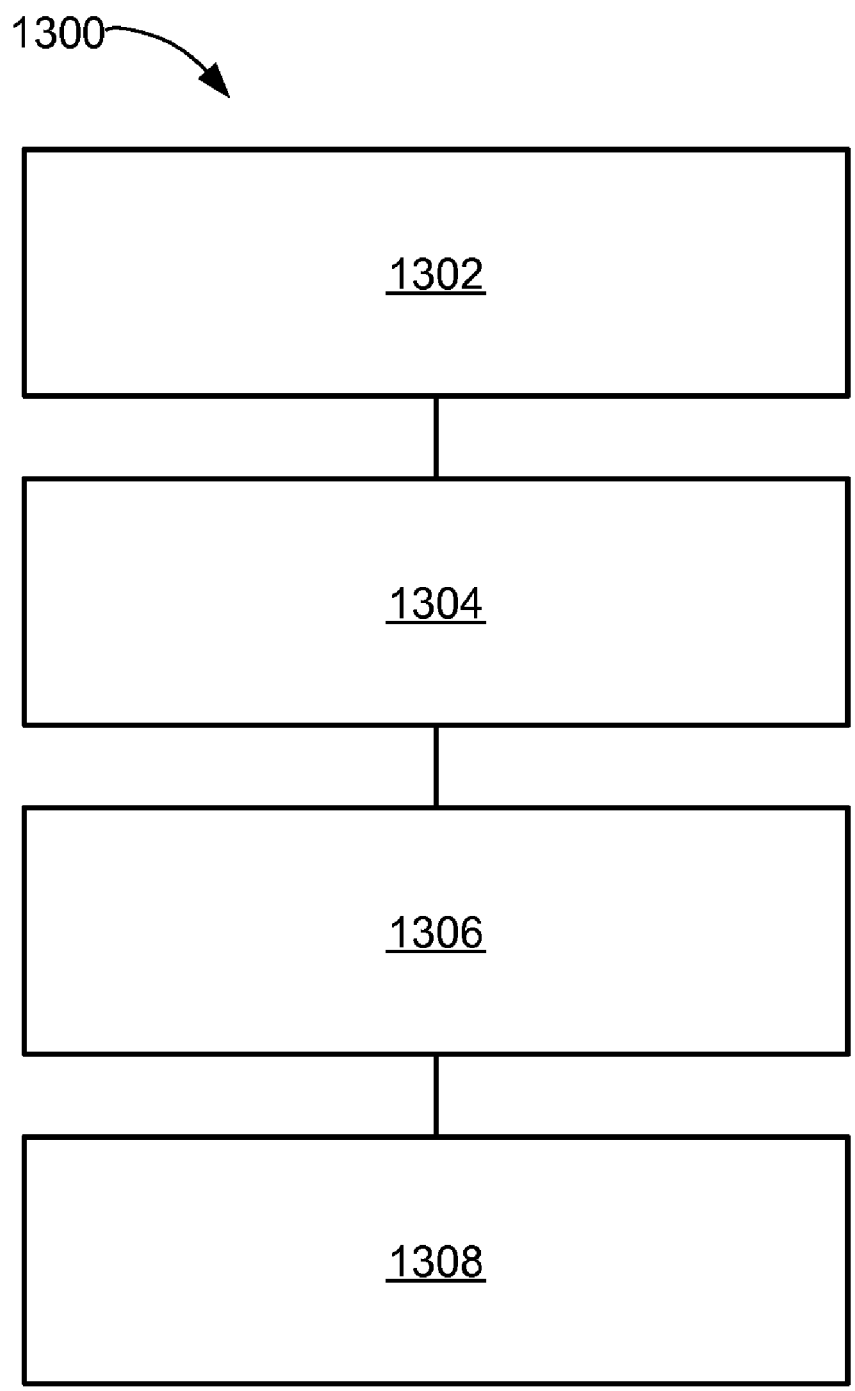
FIG. 13 is a flow chart of a method of manufacture of an integrated circuit package system in a further embodiment of the present invention.

Referring now to FIG. 13, therein is shown a flow chart of a method 1300 of manufacture of the integrated circuit package system in a further embodiment of the present invention. The method 1300 includes: forming a base package including: fabricating a base package substrate having a component side and a system side, coupling a first integrated circuit die to the component side, and coupling stacking interconnects to the component side to surround the first integrated circuit die in a block 1302; forming a stacked integrated circuit package including: fabricating a stacked package substrate having a chip side, coupling a lower stacked integrated circuit die to the chip side, and attaching on a coupling side, of the stacked package substrate, the stacking interconnects in a block 1304; stacking the stacked integrated circuit package on the base package including the stacking interconnects of the stacked integrated circuit package on the stacking interconnects of the base package in a block 1306; and forming a stacked solder column by reflowing the stacked interconnects in a block 1308.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit package systems fully compatible with conventional manufacturing methods or processes and technologies. Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   forming a base package including:
      fabricating a base package substrate having a component side and a system side,
      coupling a first integrated circuit die to the component side,
      mounting a shield to the first integrated circuit die includes mounting a heat spreader cap, and coupling stacking interconnects to the component side to surround the first integrated circuit die;

forming a stacked integrated circuit package including:
fabricating a stacked package substrate having a chip side,
coupling a lower stacked integrated circuit die to the chip side, and
attaching on a coupling side, of the stacked package substrate, the stacking interconnects;

stacking the stacked integrated circuit package on the base package including the stacking interconnects of the stacked integrated circuit package on the stacking interconnects of the base package; and forming a stacked solder column by reflowing the stacked interconnects.

2. The method as claimed in claim 1 further comprising maintaining a separation height between the base package and the stacked integrated circuit package by the height of the stacked solder column.

3. The method as claimed in claim 1 further comprising forming a package body on the base package substrate.

4. The method as claimed in claim 1 wherein coupling the stacking interconnects to the component side including molding a package body and forming vertical insertion cavities for holding the stacking interconnects.

5. A method of manufacture of an integrated circuit package system comprising:
forming a base package including:
fabricating a base package substrate having a component side and a system side including forming a component pad on the component side and a system pad on the system side,
coupling a first integrated circuit die to the component side including forming a chip interconnect between the first integrated circuit die and the component pad,
mounting a shield to the first integrated circuit die, and
coupling stacking interconnects to the component side to surround the first integrated circuit die;
forming a stacked integrated circuit package including:
fabricating a stacked package substrate having a chip side including forming a chip side contact,
coupling a lower stacked integrated circuit die to the chip side including coupling an upper stacked integrated circuit die to the chip side contact, and
attaching on a coupling side, of the stacked package substrate, the stacking interconnects;
stacking the stacked integrated circuit package on the base package in which the stacking interconnects of the stacked integrated circuit package on the stacking interconnects of the base package; and
forming a stacked solder column by reflowing the stacking interconnects.

6. The method as claimed in claim 5 further comprising maintaining a separation height between the base package and the stacked integrated circuit package by the height of the stacked solder column including filling a vertical insertion cavity.

7. The method as claimed in claim 5 further comprising forming a package body on the base package substrate including the shield coplanar with or above the package body.

8. The method as claimed in claim 5 wherein mounting the shield to the first integrated circuit die includes mounting a heat spreader cap or a discrete shield.

9. The method as claimed in claim 5 wherein coupling the stacking interconnects to the component side including molding a package body and forming vertical insertion cavities for holding the stacking interconnects.

10. An integrated circuit package system comprising:
a base package including:
a base package substrate having a component side and a system side,
a first integrated circuit die coupled to the component side,
a shield mounted to the first integrated circuit die includes a heat spreader cap, and
first stacking interconnects coupled to the component side to surround the first integrated circuit die;
a stacked integrated circuit package on the base package including:
a stacked package substrate having a chip side,
a lower stacked integrated circuit die coupled to the chip side, and
a coupling side, of the stacked package substrate, with second stacking interconnects mounted includes the second stacking interconnects on the first stacking interconnects of the base package; and
a stacked solder column formed by reflow of the first stacking interconnects and the second stacking interconnects.

11. The system as claimed in claim 10 further comprising a separation height between the base package and the stacked integrated circuit package set by the height of the stacked solder column.

12. The system as claimed in claim 10 further comprising a package body molded on the base package substrate.

13. The system as claimed in claim 10 wherein the stacking interconnects coupled to the component side includes a package body with vertical insertion cavities to hold the stacking interconnects.

14. The system as claimed in claim 10 further comprising:
the base package including:
a component pad on the component side and a system pad on the system side, and
a chip interconnect between the first integrated circuit die and the component pad;
the stacked integrated circuit package including:
a chip side contact on the chip side of the stacked package substrate, and
an upper stacked integrated circuit die coupled to the chip side contact.

15. The system as claimed in claim 14 further comprising a separation height between the base package and the stacked integrated circuit package maintained by the height of the stacked solder column includes a vertical insertion cavity filled.

16. The system as claimed in claim 14 further comprising a package body molded on the base package substrate includes the shield coplanar with or above the package body.

17. The system as claimed in claim 14 wherein the shield mounted to the first integrated circuit die includes a heat spreader cap or a discrete shield.

18. The system as claimed in claim 14 wherein the stacking interconnects coupled to the component side includes a package body with vertical insertion cavities that hold the stacking interconnects.

* * * * *